United States Patent
Yokokawa et al.

(10) Patent No.: US 8,423,864 B2
(45) Date of Patent: Apr. 16, 2013

(54) RECEIVING APPARATUS, RECEIVING METHOD, PROGRAM, AND RECEIVING SYSTEM

(75) Inventors: Takashi Yokokawa, Kanagawa (JP); Hitoshi Sakai, Kanagawa (JP)

(73) Assignee: Sony Corporation, Tokyo (JP)

( * ) Notice: Subject to any disclaimer, the term of this patent is extended or adjusted under 35 U.S.C. 154(b) by 498 days.

(21) Appl. No.: 12/726,484

(22) Filed: Mar. 18, 2010

(65) Prior Publication Data

US 2010/0245677 A1 Sep. 30, 2010

(30) Foreign Application Priority Data

Mar. 26, 2009 (JP) ................. P2009-076031

(51) Int. Cl.
*G11C 29/00* (2006.01)
(52) U.S. Cl.
USPC .......................................... 714/763; 711/157
(58) Field of Classification Search .......... 711/157; 375/341, 295, 230, 346; 360/60; 714/801, 714/752, 763; 348/725
See application file for complete search history.

(56) References Cited

U.S. PATENT DOCUMENTS

| | | | | |
|---|---|---|---|---|
| 5,063,533 A * | 11/1991 | Erhart et al. | ............ | 711/157 |
| 5,862,189 A * | 1/1999 | Huisken et al. | ............ | 375/341 |
| 6,704,848 B2 * | 3/2004 | Song | ............ | 711/157 |
| 6,754,021 B2 * | 6/2004 | Kisaka et al. | ............ | 360/60 |
| 7,801,243 B2 * | 9/2010 | Kim et al. | ............ | 375/295 |
| 8,077,798 B2 * | 12/2011 | Kim et al. | ............ | 375/295 |
| 8,179,955 B2 * | 5/2012 | Taylor et al. | ............ | 375/230 |
| 8,190,981 B2 * | 5/2012 | Jeong et al. | ............ | 714/801 |
| 2005/0226354 A1 * | 10/2005 | Shin et al. | ............ | 375/346 |

OTHER PUBLICATIONS

R. G. Gallager, "Low Density Parity Check Codes", Cambridge, Massachusetts: M. I. T. Press, 1963.
D. J. C. MacKay, "Good error correcting codes based on very parse matrices", Submitted to IEEE Trans. Inf. Theory, IT-45, pp. 399-431, 1999.
DVB BlueBook A122 Rev. 1, Frame structure channel coding and modulation for a second generation digital terrestrial television broadcasting system (DVB-T2), Dec. 2009.

* cited by examiner

*Primary Examiner* — David Ton
(74) *Attorney, Agent, or Firm* — Oblon, Spivak, McClelland, Maier & Neustadt, L.L.P.

(57) ABSTRACT

A receiving apparatus includes: a deinterleaving device configured to perform a deinterleaving process on an LDPC-coded data signal having undergone an interleaving process, the LDPC representing Low Density Parity Check, by use of a memory which has columns capable of storing as many as "a" data, the "a" being an integer of at least 1; and a control device configured such that if the data signal is supplied in units of N data, the N being an integer smaller than the "a," the control device controls the deinterleaving device to write the data signal to a predetermined address of the memory while reading previously written data from the predetermined address in a write period, the control device further controlling the deinterleaving device to stop writing the data signal to the predetermined address of the memory while reading the previously written data from the predetermined address in a write inhibit period.

9 Claims, 10 Drawing Sheets

RECEIVING APPARATUS, RECEIVING METHOD, PROGRAM, AND RECEIVING SYSTEM

BACKGROUND OF THE INVENTION

1. Field of the Invention

The present invention relates to a receiving apparatus, a receiving method, a program, and a receiving system. More particularly, the invention relates to a receiving apparatus, a receiving method, a program, and a receiving system for performing a time deinterleaving process suitable for DVB-T.2-compatible receivers.

2. Description of the Related Art

Communication systems perform reliable communications over noise-plagued communication channels by resorting to coding. For example, wireless systems such as satellite-based networks are exposed to numerous noise sources due to geographical and environmental factors. Such communication channels represent fixed capacities which are defined in terms of the number of bits per symbol at a given signal-to-noise ratio (SNR) and which constitute a theoretical upper limit known as the Shannon limit. As a result, coding design aims at attaining rates that approach the Shannon limit. This aim is closely related to limited bandwidth satellite-based systems.

Recent years have witnessed the development of coding techniques known as turbo coding which help to achieve performance levels getting close to the Shannon limit. Specifically, the developed techniques include Parallel Concatenated Convolutional Codes (PCCC) and Serially Concatenated Convolutional Codes (SCCC). Apart from these turbo coding techniques, Low Density Parity Check Codes (called LDPC coding hereunder), a traditional coding technique known from long ago, are again attracting attention today.

LDPC coding was first proposed by R. G. Gallager in "Low Density Parity Check Codes," Cambridge, Mass.: M. I. T. Press, 1963. Later, the technique once again drew attention when discussed illustratively by D. J. C. MacKay in "Good error correcting codes based on very parse matrices," submitted to IEEE Trans. Inf. Theory, IT-45, pp. 399-431, 1999, and by M. G. Luby, M. Mitzenmacher, M. A. Shokrollahi and D. A. Spielman, in "Analysis of low density codes and improved designs using irregular graphs," in Proceedings of ACM Symposium on Theory of Computing, pp. 249-258, 1998.

Studies in recent years have made it increasingly clear that LDPC coding, when its code length is prolonged, provides performance levels approaching the Shannon limit like turbo coding. Because its minimum distance is proportional to its code length, LDPC coding offers an excellent block error rate and develops few so-called error floor phenomena, which can be observed in decoding characteristic by turbo coding arrangements.

The above-mentioned advantages of LDPC coding have led to the adoption of this coding technique into DVB (Digital Video Broadcasting)-T.2 (DVB BlueBook A122 Rev. 1, Frame structure channel coding and modulation for a second generation digital terrestrial television broadcasting system (DVB-T2), searched for on Mar. 17, 2009 at the DVB site dated Sep. 1, 2008<URL: http://www.dvb.org/technology/standards/> (Non-Patent Document 1)). That is, DVB-T.2 is the second generation digital terrestrial TV broadcasting standard being deliberated on (as of March 2009) by ETSI (European Telecommunication Standard Institute).

The DVB-T.2-compatible receiver incorporates a time deinterleaver. That is, the signal input to the receiver has undergone a block interleaving process (time interleaving process) performed across a plurality of LDPC codes on the transmitting side. This process is carried out in units of cells (in units of constellations in this case). Thus the time deinterleaver performs a deinterleaving process corresponding to the time interleaving process on the input signal.

Specifically, the time deinterleaver may have a memory that stores "a" cells in the column direction and "b" cells in the row direction. Thus the time deinterleaver performs the time deinterleaving process by writing supplied cell data successively to a predetermined address of the memory in units of N cell data (N is an integer of at least 1) and by reading out successively the written cell data from the same address.

In the description that follows, each storage area which is one cell long in the row direction and which extends in the column direction will be called a column. Also, the number of units N in which cell data are written by the time deinterleaver will be called the column count N in the ensuing description.

SUMMARY OF THE INVENTION

However, the column count N of the data input to the time deinterleaver of the DVB-T.2-compatible receiver can vary at intervals of a T2 frame. This means that the time deinterleaving process may not be carried out properly unless appropriate arrangements are implemented. The need has been recognized for techniques for bringing about such arrangements. However, the need has yet to be adequately met.

The present embodiment has been made in view of the above circumstances and provides a receiving apparatus, a receiving method, a program, and a receiving system for performing a time deinterleaving process suitable for DVB-T.2-compatible receivers.

In carrying out the present invention and according to one embodiment thereof, there is provided a receiving apparatus including: a deinterleaving device configured to perform a deinterleaving process on an LDPC-coded data signal having undergone an interleaving process, the LDPC representing Low Density Parity Check, by use of a memory which has columns capable of storing as many as "a" data, the "a" being an integer of at least 1. The receiving apparatus further includes a control device configured such that if the data signal is supplied in units of N data, the N being an integer smaller than the "a," then the control device controls the deinterleaving device to write the data signal to a predetermined address of the memory while reading previously written data from the predetermined address in a write period, the control device further controlling the deinterleaving device to stop writing the data signal to the predetermined address of the memory while reading the previously written data from the predetermined address in a write inhibit period.

Preferably, the period in which to write the "a" data may be determined to be one unit; the write period may be predetermined to correspond to the N data; and the write inhibit period may be predetermined to correspond to (a-N) data within that one unit.

Preferably, the period corresponding to the first N data may be predetermined to be the write period and the period corresponding to the last (a-N) data may be predetermined to be the write inhibit period within that one unit.

Preferably, the receiving apparatus may comply with Digital Video Broadcasting T.2 known as DVB-T.2.

Preferably, the data signal may have undergone a block interleaving process across a plurality of LDPC codes.

According to another embodiment of the present invention, there is provided a receiving method for use with the above-outlined receiving apparatus and representing the controlling function thereof, as well as a program for causing a computer to execute a control process equivalent to the receiving method.

As outlined above, the present embodiment provides the receiving apparatus, receiving method, and program, the receiving apparatus including a deinterleaving device configured to perform a deinterleaving process on an LDPC-coded data signal having undergone an interleaving process (LDPC representing Low Density Parity Check) by use of a memory which has columns capable of storing as many as "a" data ("a" being an integer of at least 1). If the data signal is supplied in units of N data (N being an integer smaller than the "a"), then the deinterleaving device is controlled to write the data signal to a predetermined address of the memory while reading previously written data from the predetermined address in a write period. Also, the deinterleaving device is controlled to stop writing the data signal to the predetermined address while reading the previously written data from the predetermined address in a write inhibit period.

According to a further embodiment of the present invention, there is provided a receiving system including: an acquisition device configured such that if an LDPC-coded data signal having undergone an interleaving process, the LDPC representing Low Density Parity Check, is transmitted over a channel, then the acquisition device acquires the data signal; and a transmission channel decoding device configured to perform a channel decoding process on the data signal acquired by the acquisition device over the channel, the channel decoding process at least including a process for correcting errors that may have occurred over the channel, the channel decoding device further outputting the signal thus processed. The receiving system further includes either an information source decode processing device configured to perform an information source decoding process on the signal output from the channel decoding device, or a recording device configured to record the signal output from the channel decoding device to a recording medium. The channel decoding device includes: a deinterleaving device configured to perform a deinterleaving process on the data signal acquired by the acquisition device, by use of a memory which has columns capable of storing as many as "a" data, the "a" being an integer of at least 1. The channel decoding device further includes a control device configured such that if the data signal is supplied in units of N data, the N being an integer smaller than the "a," then the control device controls the deinterleaving device to write the data signal to a predetermined address of the memory while reading previously written data from the predetermined addresses in a write period, the control device further controlling the deinterleaving device to stop writing the data signal to the predetermined address while reading the previously written data from the predetermined address in a write inhibit period.

As outlined above, the present embodiment provides the receiving system including an acquisition device configured such that if an LDPC-coded data signal having undergone an interleaving process (LDPC representing Low Density Parity Check) is transmitted over a channel, then the acquisition device acquires the data signal; and a transmission channel decoding device configured to perform a channel decoding process on the data signal acquired by the acquisition device over the channel, the channel decoding process at least including a process for correcting errors that may have occurred over the channel, the channel decoding device further outputting the signal thus processed. The receiving system further includes either an information source decode processing device configured to perform an information source decoding process on the signal output from the channel decoding device, or a recording device configured to record the signal output from the channel decoding device to a recording medium. The channel decoding device includes a deinterleaving device configured to perform a deinterleaving process on the data signal acquired by the acquisition device, by use of a memory which has columns capable of storing as many as "a" data ("a" being an integer of at least 1). If the data signal is supplied in units of N data (N being an integer smaller than the "a"), then the deinterleaving device is controlled to write the data signal to a predetermined address of the memory while reading previously written data from the predetermined address in a write period. Also, the deinterleaving device is controlled to stop writing the data signal to the predetermined address of the memory while reading the previously written data from the predetermined address in a write inhibit period.

As outlined above, the present embodiment provides the arrangements making it possible to implement the time deinterleaving process suitable for DVB-T.2-compatible receivers.

DETAILED DESCRIPTION OF THE PREFERRED EMBODIMENTS

Structure of the Receiving Apparatus Complying with DVB-T.2

Figure 1:
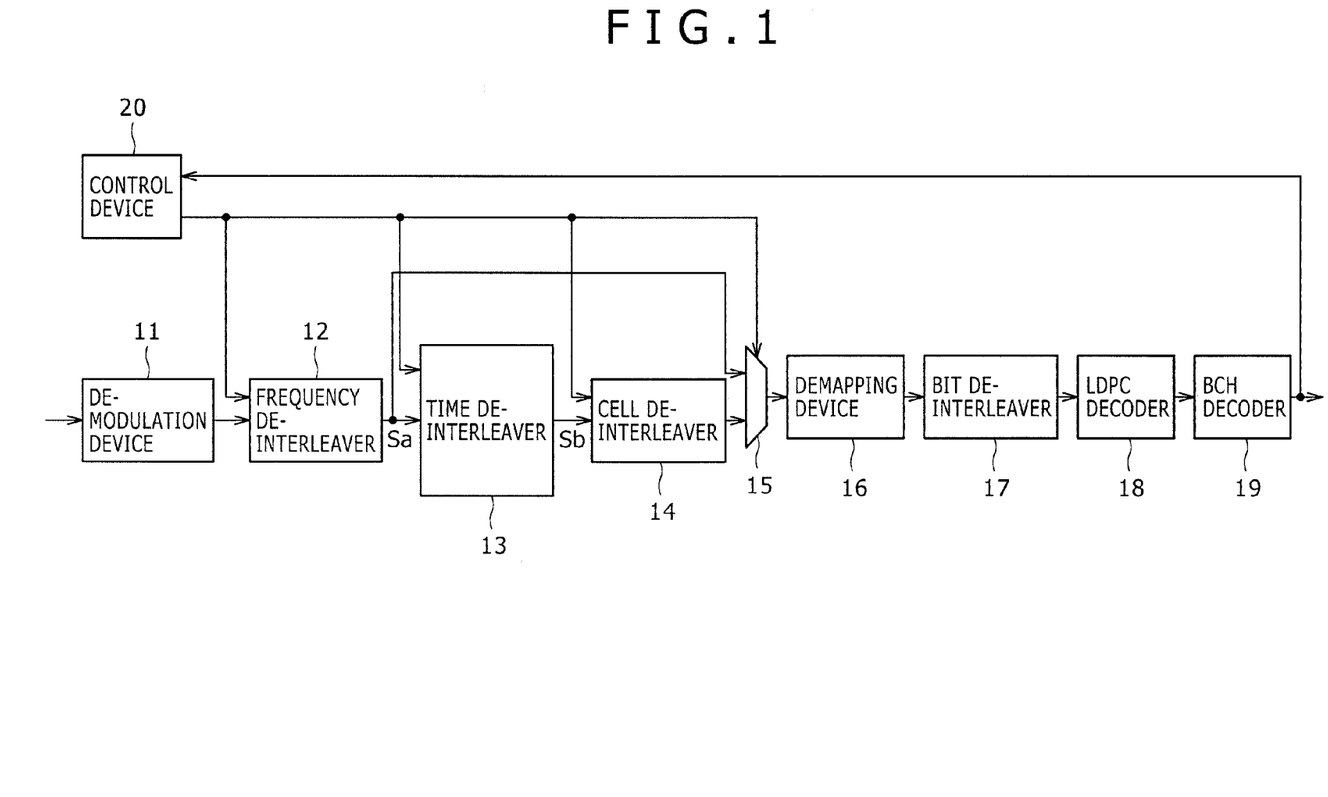
FIG. 1 is a schematic view showing a typical structure of a receiving apparatus practiced as one embodiment of the present invention.

FIG. 1 schematically shows a typical structure of a receiving apparatus practiced as one preferred embodiment of the present invention.

In digital broadcasting under DVB-T.2, LDPC codes are turned into symbols of orthogonal modulation (digital modulation) such as QPSK (Quadrature Phase Shift Keying), and these symbols are mapped at constellation points before being transmitted. Illustratively, the receiving apparatus of FIG. 1 adopts OFDM (Orthogonal Frequency Division Multiplexing) as the modulation system for digital broadcasting.

The receiving apparatus of FIG. 1 functions as a digital broadcast receiving apparatus that complies with DVB-T.2. The DVB-T.2-compatible receiving apparatus is structured to include a demodulation device 11, a frequency deinterleaver 12, a time deinterleaver 13, a cell deinterleaver 14, a switching device 15, a demapping device 16, a bit deinterleaver 17, an LDPC decoder 18, a BCH decoder 19, and a control device 20.

Broadcast waves from a broadcasting station, not shown, are received by the receiving apparatus of FIG. 1. Inside the receiving apparatus, the received broadcast waves are turned into an IF (Intermediate Frequency) signal by a tuner or the like, not shown, the IF signal being forwarded to the demodulation device 11. The demodulation device 11 orthogonally demodulates the IF signal into a baseband OFDM signal that is output and fed to the frequency deinterleaver 12.

In turn, the frequency deinterleaver 12 performs a frequency deinterleaving process on the OFDM signal from the demodulation device 11. That is, the frequency deinterleaver 12 is designed to deinterleave what is interleaved in closed fashion within OFDM symbols. The deinterleaving process is carried out in units of cells (in units of OFDM carriers in this example).

Of the elements of the output signal Sa from the frequency deinterleaver 12, the signal element corresponding to PLP (physical layer pipe) is fed to the time deinterleaver 13. Of the other elements of the output signal Sa, the signal element corresponding to L1 (included in the P2 symbol) is forwarded to the switching device 15.

PLPs denote data streams and L1 represents Layer 1 (physical layer) transmission parameters under DVB-T.2. In addition to modulation and demodulation parameters, L1 includes the position and size of each PLP and the error-correcting system in use. In the case of multiple PLPs (called multi-PLPs hereunder), the positions and sizes of PLPs vary from one T2 frame to another. This means that unless L1 is taken, any desired PLP cannot be extracted following a frequency deinterleaving process. The T2 frame is the unit of data transmission on the physical layer under DVB-T.2. As such, the T2 frame is composed of P1 and P2 symbols as well as data symbols including a PLP. L1 is included in a P2 symbol of each T2 frame. Details of L1 are disclosed illustratively in the above-cited Non-Patent Document 1.

The signal Sa (excluding L1) output from the frequency deinterleaver 12 and input to the time deinterleaver 13 has undergone a block interleaving process (time interleaving process) performed across a plurality of LDPC codes on the transmitting side. This process is carried out in units of cells (in units of constellations in this example). Parenthetically, where the time deinterleaver 13 is mentioned, the signal Sa (excluding L1) input to the time deinterleaver 13 will be simply called the input signal Sa hereunder. Thus the time deinterleaver 13 performs a deinterleaving process corresponding to the time interleaving process on the input signal Sa and feeds the cell deinterleaver 14 with the signal Sb resulting from the deinterleaving process as an output signal.

As described above, the input signal Sa to the time deinterleaver 13 is a signal in which the column count N can vary from one T2 frame to another.

For that reason, this embodiment is furnished illustratively with the memory (e.g., memory 21 in FIG. 2, to be discussed later) having as many columns as a maximum column count "a" of the input signal Sa. The period equivalent to one in which to write as many cell data as the maximum column count "a" of the input signal Sa is regarded as one unit. If the column count N of the input signal Sa is less than the maximum column count "a," the period in which to write cell data within one unit is predetermined to correspond to N columns. In other words, the period in which the writing of cell data is inhibited is predetermined to correspond to (a-N) columns. In the ensuing description, the period in which to write cell data will be called the write-ready period, and the period in which the writing of cell data is inhibited will be referred to as the write inhibit period.

In the write-ready period, the control device 20 causes the frequency deinterleaver 12 to supply the next write-ready cell data to the time deinterleaver 13 as the input signal Sa to the latter. The time deinterleaver 13 writes the write-ready cell data to the address targeted for a write operation while reading previously written data from the same target address. Then the control device 20 updates the target address to a new address. The technique for updating the target address is not limited to anything specific. How the target address is typically updated will be discussed later in reference to FIGS. 3 through 6.

In the write inhibit period, the control device 20 stops the supply of the input signal Sa to the time deinterleaver 13. In turn, the time deinterleaver 13 reads the previously written data from the target address without writing any data to that address.

Obviously, regardless of the write-ready period or write inhibit period being in effect, if there is no data written at the target address, no data will be read therefrom. In this specification, such an eventuality is also included in the expression of "reading previously written data from the target address."

The technique for implementing the above-mentioned series of processes performed by the control device 20 and time deinterleaver 13 is part of the arrangements proposed by the present embodiment. In the ensuing description, this technique will be referred to as the variable column-ready time deinterleaving technique. The variable column-ready time deinterleaving technique is one of the effective arrangements for bringing about the time deinterleaving process suitable for DVB-T.2-compatible receivers. Details of the variable column-ready time deinterleaving technique will be described later in reference to FIGS. 2 through 6.

The signal Sb output from the time deinterleaver 13 and input to the cell deinterleaver 14 has undergone an interleaving process (cell interleaving process) closed within LDPC codes on the transmitting side. This process is carried out in units of cells (in units of constellations in this example). Thus the cell deinterleaver 14 performs a deinterleaving process corresponding to the cell interleaving process on the input signal Sb and feeds the switching device 15 with the signal resulting from the deinterleaving process.

In the manner described above, a transmission control signal corresponding to L1 output from the frequency deinterleaver 12 (the control signal is simply called L1 hereunder where appropriate) and a data signal corresponding to the PLP output from the cell deinterleaver 14 (the data signal is simply called the data hereunder where appropriate) are supplied to the input of the switching device 15. Under control of the control device 20, the switching device 15 selects either L1 or the data as its output data.

More specifically, with this embodiment in a normal state under control of the control device 20, the switching device 15 outputs the data input from the cell deinterleaver 14. When L1 is output from the frequency deinterleaver 12, the switching device 15 under control of the control device 20 outputs L1 through interrupt handling. That is, when L1 is output from the frequency deinterleaver 12, the control device 20 interrupts the operations of the time deinterleaver 13 and cell deinterleaver 14 and allows L1 to reach the LDPC decoder 18 via the demapping device 16 and bit deinterleaver 17 so that the LDPC decoder 18 puts L1 to LDPC decoding.

The demapping device 16 converts the output data from the switching device 15 into LDPC-coded data in units of sign bits and feeds the converted data to the bit deinterleaver 17.

The data output from the demapping device 16 and input to the bit deinterleaver 17 has undergone a bit interleaving process in units of LDPC sign bits on the transmitting side. Thus the bit deinterleaver 17 performs a bit deinterleaving process on the input data to obtain an LDPC code with its sign bit reverted to the position in effect before the bit interleaving process. The signal made up of such LDPC codes is fed to the LDPC decoder 18 as an output signal from the bit deinterleaver 17.

That is, the output signal from the bit deinterleaver 17 becomes the input signal to the LDPC decoder 18. The LDPC decoder 18 then performs an LDPC decoding process on the input signal using a conversion check matrix generated from the check matrix utilized in the LDPC coding process on the transmitting side. The data resulting from the LDPC decoding process is fed to the BCH decoder 19.

The data output from the LDPC decoder 18 and input to the BCH decoder 19 has undergone a BCH (Bose-Chaudhuri-Hocquenghem) coding process as the error-correcting process on the transmitting side. The BCH decoder 19 thus decodes the BCH-coded data and outputs the data acquired from the decoding process to the outside.

The control device 20 controls the operations of the components ranging from the frequency deinterleaver 12 to the switching device 15 typically based on the output data from the BCH decoder 19.

Illustratively, the control device 20 exercises control to implement the variable column-ready time deinterleaving technique.

[Explanation of the Variable Column-Ready Time Deinterleaving Technique]

Examples of the variable column-ready time deinterleaving technique will be explained below in reference to FIGS. 2 through 7.

Figure 2:
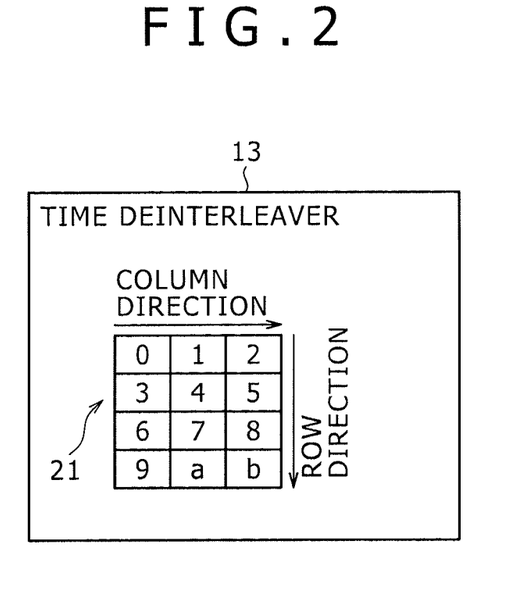
FIG. 2 is a schematic view showing a typical structure of a memory used by a time deinterleaver of the receiving apparatus whose typical structure is illustrated in FIG. 1.

FIG. 2 schematically shows a typical structure of a memory 21 of the time deinterleaver 13.

In FIG. 2, each of boxes "0" through "b" making up a 3 by 4 rectangular shape represents an address. The numeral at each address denotes the address number of that address in the memory 21.

The memory 21 in FIG. 2 has a capacity large enough to accommodate up to 3 cells in the column direction (i.e., horizontal direction, ready for the time deinterleaving process) and up to 4 cells in the row direction (vertical direction) in each of the 3 columns.

That the memory 21 is made up of 3 columns signifies that the maximum column count "a" is 3 in the input signal Sa to the time deinterleaver 13. The maximum column count "3" is assumed to be 3 for purpose of simplification and illustration. Obviously, the maximum column count "a" is not limited to any specific number. In other words, the memory for use by the time deinterleaver 13 is not structurally limited to the memory 21 in FIG. 2; the memory need only have a structure having the same number of columns as the maximum column count "a."

Figure 3:
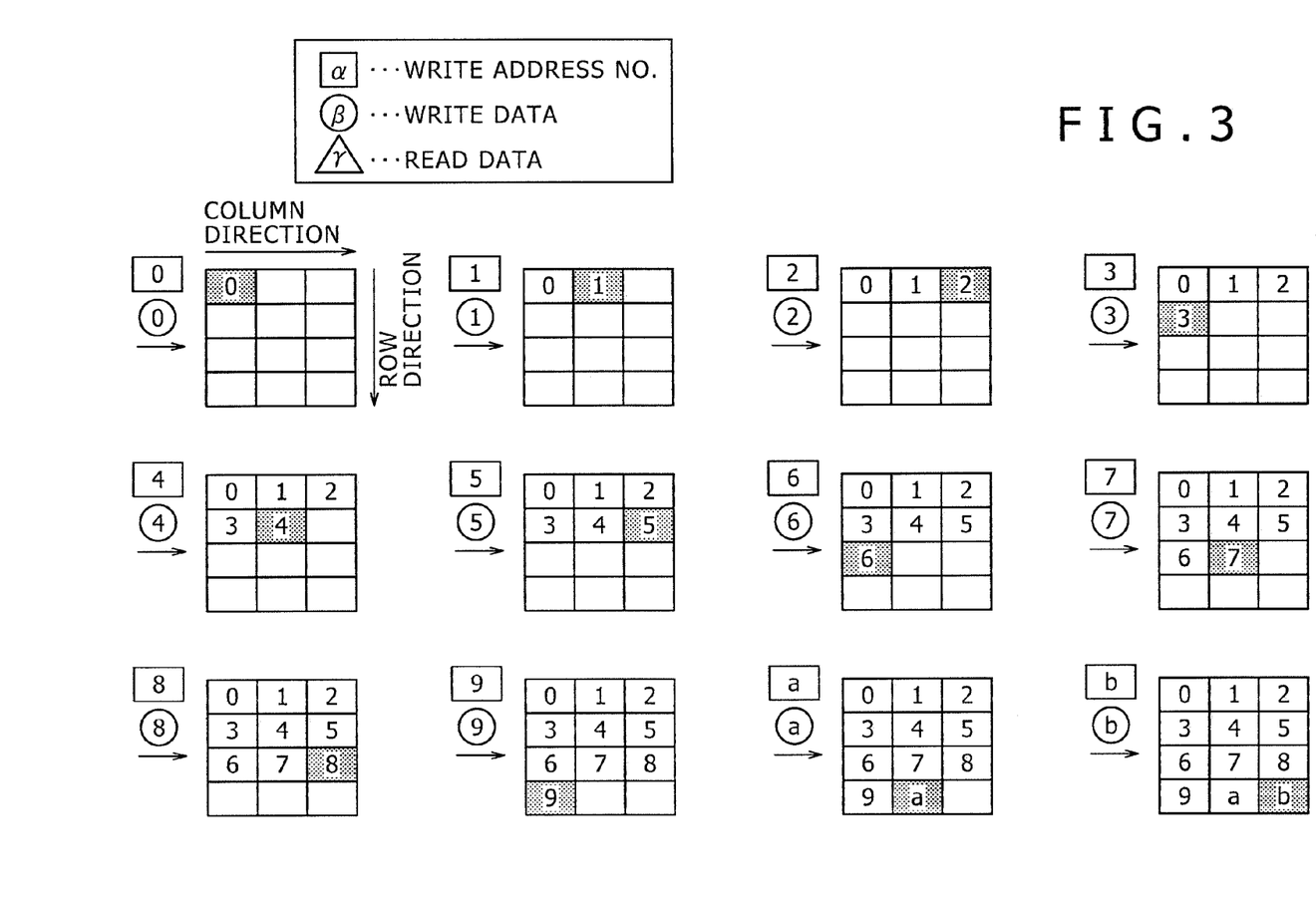
FIG. 3 is a schematic view showing a typical process performed by the time deinterleaver of the receiving apparatus in FIG. 1.

FIG. 3 shows a first process of the deinterleaving processing performed by the time deinterleaver 13, i.e., the process in which only the writing of data takes place.

At the initial point in the process of FIG. 3, the column count N (=maximum column count "a") is assumed to be 3 in the input signal Sa.

In FIG. 3, the 3 by 4 rectangular shapes constitute the contents recorded in the memory 21. Inside each 3 by 4 rectangular shape, each component box denotes one address, and the numeral at each address represents recorded data. It should be noted that the numeral at each address does not stand for an address number (this is different from FIG. 2). Of the addresses (i.e., boxes), those shown shaded denote the addresses targeted to be processed. In the top left corner and above an arrow sign on the left of each 3 by 4 rectangular shape, the numeral in a rectangular box stands for the address number (i.e., address number of the address targeted to be processed), and the numeral in a circle represents write data (i.e., cell data to be written). That is, the data composed of the numeral in the circle is to be written to the address of which the address number is shown in the rectangular box (i.e., target address). At this time, the previously written data at the address whose address number is shown in the rectangular box is to be read therefrom. The read data is shown as a numeral enclosed in a triangle above an arrow sign (not shown in FIG. 3) on the right of each 3 by 4 rectangular shape. The description in this paragraph applies to FIGS. 4 through 6 as well.

In the example of FIG. 3, the target addresses are updated in ascending order of their address numbers (i.e., 0, 1, 2, 3, 4, 5, 6, 7, 8, 9, "a" and "b," in that order).

Suppose that the write-ready data (i.e., the input signal Sa to the time deinterleaver 13) is made up of (0, 1, 2), (3, 4, 5), (6, 7, 8) and (9, a, b), each pair of parentheses denoting a set of cell data corresponding to the maximum column count "a" (=3 in this example). That is, the input signal Sa in the example of FIG. 3 includes sets of cell data each made up of three numerals, which indicates that the column count N is 3 (=maximum column count "a").

In this case, as indicated by the rectangular shapes and their accompanying numerals in FIG. 3, the data 0, 1, 2, 3, 4, 5, 6, 7, 8, 9, "a," and "b" are written to the addresses numbered 0, 1, 2, 3, 4, 5, 6, 7, 8, 9, "a" and "b," respectively.

Where the above state is in effect, suppose that the column count N is changed from 3 to 2. Illustratively, it is assumed that the input signal Sa to the time deinterleaver 13 is made up of (0, 1, x), (2, 3, x), (4, 5, x), and (6, 7, x), the symbol "x" in each pair of parentheses indicating the absence of data. Each pair of parentheses in the input data Sa contains two numerals, which indicates that the column count N is 2.

Figure 4:
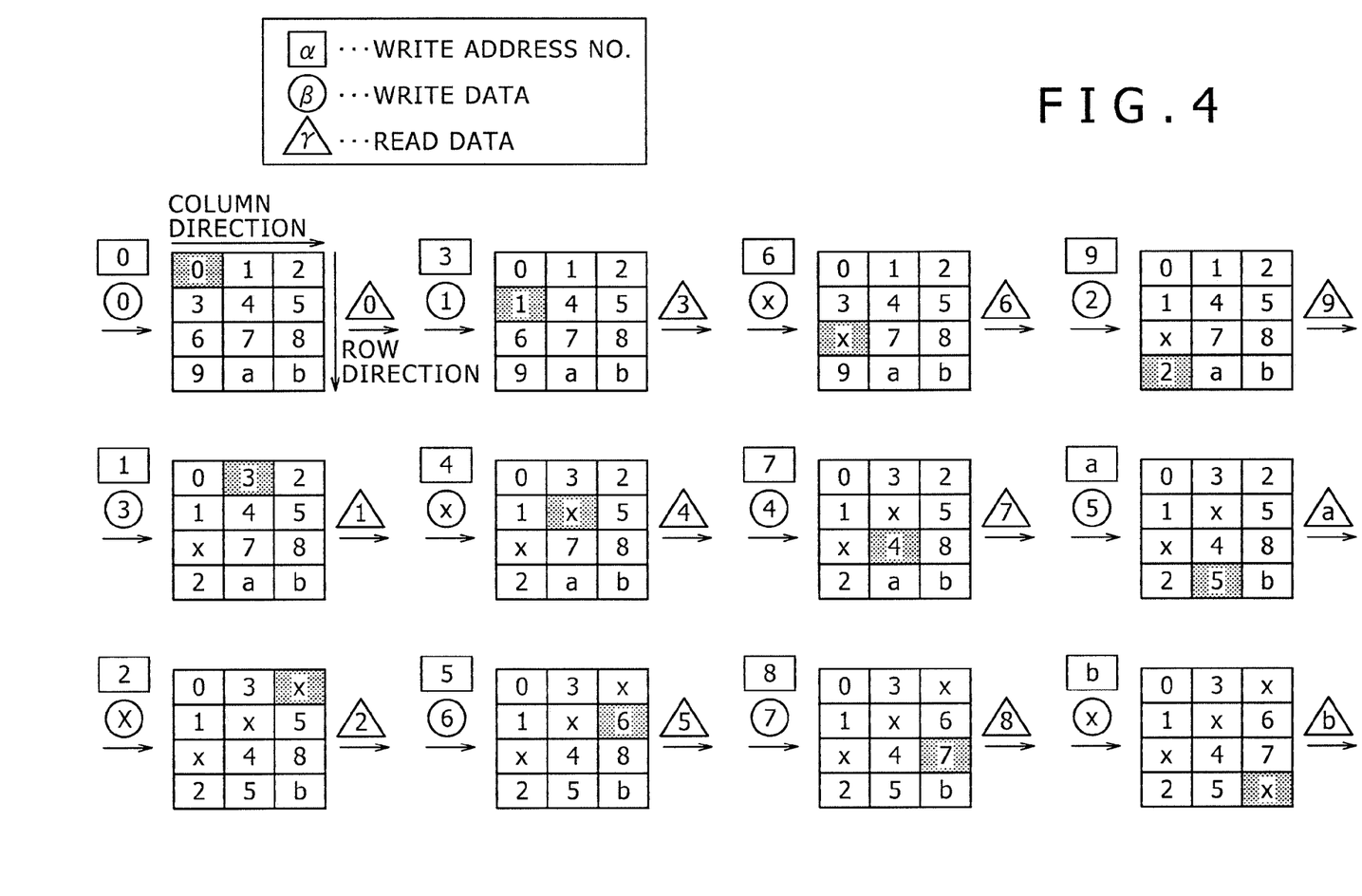
FIG. 4 is a schematic view showing a typical process performed by the time deinterleaver of the receiving apparatus in FIG. 1.

FIG. 4 is a schematic view explanatory of a typical process performed by the time deinterleaver 13 after the column count is changed from 3 to 2. The process in FIG. 4 is continued from that in FIG. 3.

In the example of FIG. 4, the target addresses are updated in ascending order of their address numbers (i.e., 0, 3, 6, 9, 1, 4, 7, "a," 2, 5, 8 and "b," in that order).

In this case (this description applies not only to the example shown in FIG. 4 but also to those in FIGS. 5 and 6, to be discussed later), the period equivalent to one in which to write 3 cell data corresponding to the maximum column count "a" (=3) of the input signal Sa is regarded as one unit. Within one unit, the period in which to write the first 2 cell data is regarded as the write-ready period, and the period in which to write the last single cell data item is regarded as the write inhibit period.

In the write-ready period, as described above, the control device 20 causes the frequency deinterleaver 12 to supply the next write data to the time deinterleaver 13 as the input signal Sa to the latter. The time deinterleaver 13 writes the write data to the target address while reading previously written data from the same target address. The control device 20 then updates the target address to a new address.

In the ensuing description, if the address with an address number K (K being one of the symbols 0 through b) is targeted for a write operation, then that address may be called address K where appropriate.

Illustratively, in the first write-ready period, write data "0" is written to address 0, and previously written data "0" is retrieved from the same address 0 as the read data.

In the next write-ready period, write data "1" is written to address 3, and previously written data "3" is retrieved from the same address 3 as the read data.

The next period is the write inhibit period. The control device 20, as discussed above, stops the supply of the input signal Sa to the write deinterleaver 13 in the write inhibit period. In turn, the time deinterleaver 13 reads the previously written data from the target address without writing any data to that address.

That is, in the write inhibit period after the address targeted for processing is changed from address 0 to address 6, no data is written to address 6 while previously written data "6" is retrieved from the same address 6 as the read data.

Incidentally, the cross sign (x) in each circle indicates that the input signal Sa to the time deinterleaver 13 is not stopped, i.e., that nothing is written to the target address.

The above-described operations covering 3 columns are repeated thereafter.

That is, in the initial write-ready period during the operations covering the next 3 columns, write data "2" is written to address 9 while previously written data "9" is retrieved from the same address 9 as the read data.

In the next write-ready period, write data "3" is written to address 1 while previously written data "1" is retrieved from the same address 1 as the read data.

In the next write inhibit period, nothing is written to address 4 while previously written data "4" is retrieved from the same address 4 as the read data.

In the initial write-ready period during the operations covering the next 3 columns, write data "4" is written to address 7 while previously written data "7" is retrieved from the same address 7 as the read data.

In the next write-ready period, write data "5" is written to address "a" while previously written data "a" is retrieved from the same address "a" as the read data.

In the next write inhibit period, nothing is written to address 2 while previously written data "2" is retrieved from the same address 2 as the read data.

In the initial write-ready period during the operations covering the next 3 columns, write data "6" is written to address 5 while previously written data "5" is retrieved from the same address 5 as the read data.

In the next write-ready period, write data "7" is written to address 8 while previously written data "8" is retrieved from the same address 8 as the read data.

In the next write inhibit period, nothing is written to address "b" while previously written data "b" is retrieved from the same address "b" as the read data.

As a result of the operations described above, the input signal Sa to the time deinterleaver 13 is written to the memory 21 in the form of (0, 1, x), (2, 3, x), (4, 5, x), and (6, 7, x) while the output signal Sb from the time deinterleaver 13 is retrieved from the memory 21 in the form of (0, 3, 6, 9), (1, 4, 7, a), and (2, 5, 8, b). That is, when attention is drawn to the read data (i.e., output signal Sb from the time deinterleaver 13), a three-column deinterleaving process is considered to be implemented. When attention is brought to the write data (i.e.,  input signal Sa to the time deinterleaver 13), 2 cell data are written while 3 cell data have been retrieved.

Illustratively, the input signal Sa to the time deinterleaver 13 is supplied next in the form of (0, 1, x), (2, 3, x), (4, 5, x), and (6, 7, x).

Figure 5:
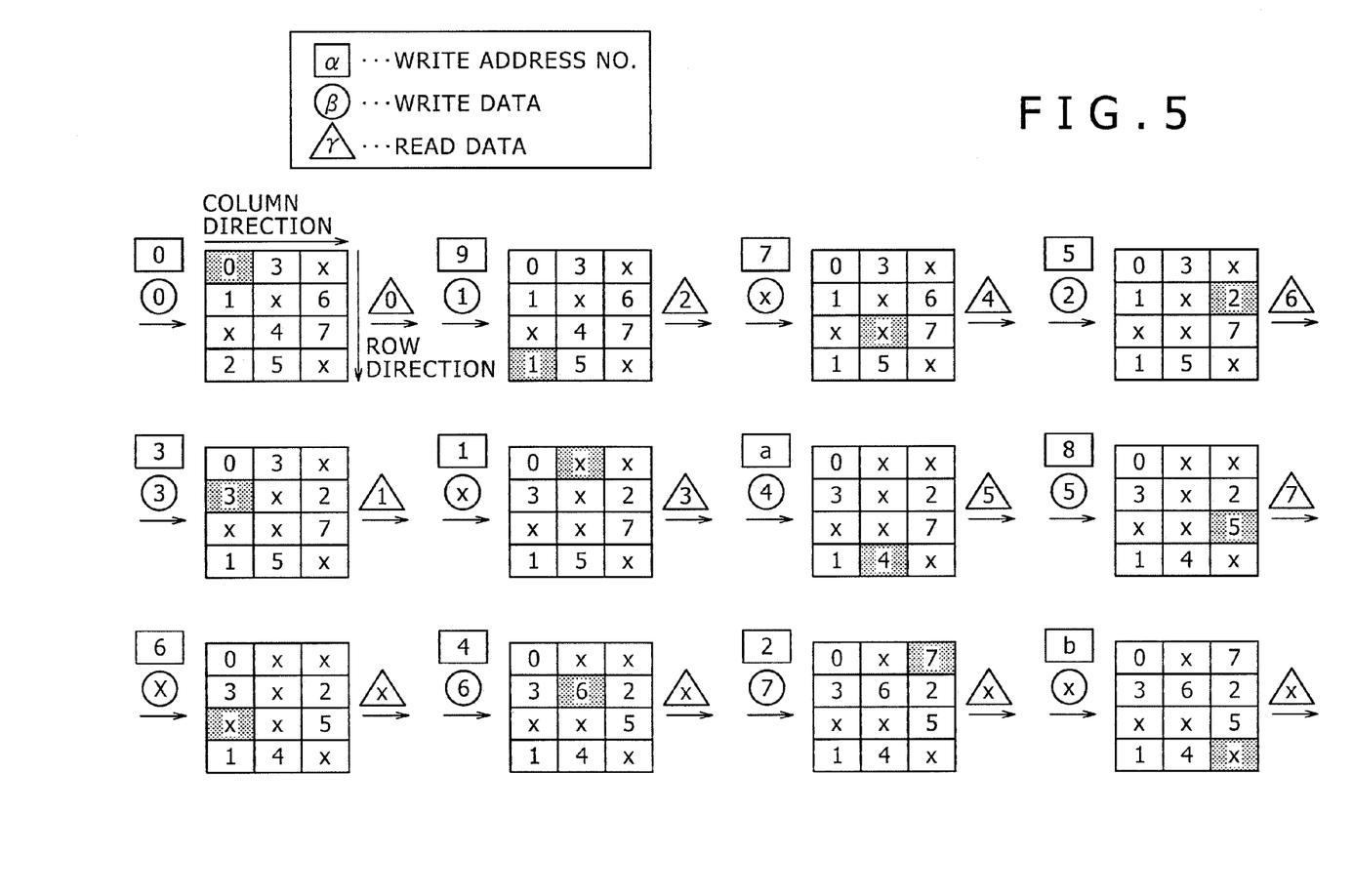
FIG. 5 is a schematic view showing a typical process performed by the time deinterleaver of the receiving apparatus in FIG. 1.

FIG. 5 shows a typical deinterleaving process performed by the time deinterleaver 13 while the number of columns remains 2, which is smaller than the maximum column count of 3 as discussed above. This process is continued from that in FIG. 4.

In the example of FIG. 5, the target addresses are updated in ascending order of their address numbers (i.e., 0, 9, 7, 5, 3, 1, "a," 8, 6, 4, 2 and "b," in that order).

That is, in the initial write-ready period in FIG. 5, write data "0" is written to address 0 while previously written data "0" is retrieved from the same address 0 as the read data.

In the next write-ready period, write data "1" is written to address 9 while previously written data "2" is retrieved from the same address 9 as the read data.

In the next write inhibit period, nothing is written to address 7 while previously written data "4" is retrieved from the same address 7 as the read data.

The above-described operations covering 3 columns are repeated thereafter.

That is, in the initial write-ready period during the operations covering the next 3 columns, write data "2" is written to address 5 while previously written data "6" is retrieved from the same address 5 as the read data.

In the next write-ready period, write data "3" is written to address 3 while previously written data "1" is retrieved from the same address 3 as the read data.

In the next write inhibit period, nothing is written to address 1 while previously written data "3" is retrieved from the same address 1 as the read data.

That is, in the initial write-ready period during the operations covering the next 3 columns, write data "4" is written to address "a" while previously written data "5" is retrieved from the same address "a" as the read data.

In the next write-ready period, write data "5" is written to address 8 while previously written data "7" is retrieved from the same address 8 as the read data.

In the next write inhibit period, nothing is written to address 6 while nothing is retrieved from the same address 6 at which no data was written previously.

Incidentally, the cross sign (x) in each triangle indicates that no cell data is retrieved from the target address as the output signal Sb of the time deinterleaver 13, i.e., that nothing was previously written at the target address.

In the initial write-ready period during the operations covering the next 3 columns, write data "6" is written to address 4 while no data is retrieved from the same address 4 since no data was previously written at address 4.

In the next write-ready period, write data "7" is written to address 2 while no data is retrieved from the same address 2 since no data was previously written at address 2.

In the next write inhibit period, nothing is written to address "b" while no data is retrieved from the same address "b" since no data was previously written at address "b."

As a result of the operations described above, the input signal Sa to the time deinterleaver 13 is written to the memory 21 in the form of (0, 1, x), (2, 3, x), (4, 5, x), and (6, 7, x) while the output signal Sb from the time deinterleaver 13 is retrieved from the memory 21 in the form of (0, 2, 4, 6), (1, 3, 5, 7), and (x, x, x, x).

The cross sign (x) in the output signal Sb from the time deinterleaver 13 indicates the absence of data. That is, the last pair of parentheses in the output signal Sb is filled with cross signs (x), which means that no data is retrieved during that period.

As described, when attention is drawn to the read data (i.e., output signal Sb from the time deinterleaver 13), a two-column deinterleaving process is considered to be implemented. When attention is brought to the write data (i.e., input signal Sa to the time deinterleaver 13), 2 cell data are written while 3 cell data have been retrieved.

When attention is focused on the write data (i.e., output signal Sb from the time deinterleaver 13), 2 cell data are written while 3 cell data have been retrieved.

Where the above state is in effect, suppose now that the column count N is again changed from 2 to 3. Illustratively, it is assumed that the input signal Sa to the time deinterleaver 13 is made up of (0, 1, 2), (3, 4, 5), (6, 7, 8), and (9, a, b).

As described above, FIG. 6 is a schematic view explanatory of a typical process performed by the time deinterleaver 13 after the column count is changed from 2 to 3. The process in FIG. 6 is continued from that in FIG. 5.

Figure 6:
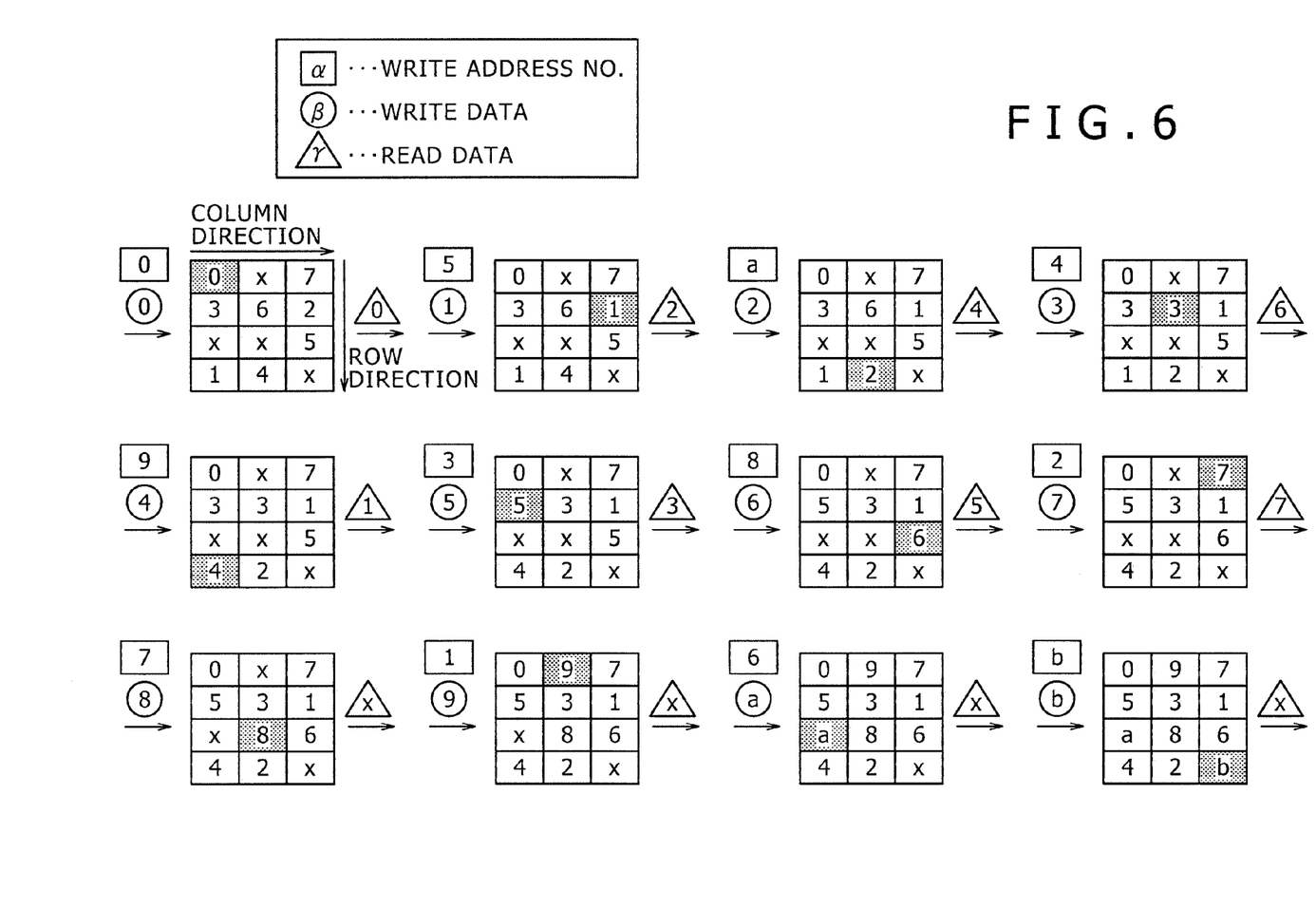
FIG. 6 is a schematic view showing a typical process performed by the time deinterleaver of the receiving apparatus in FIG. 1.

In the example of FIG. 6, the target addresses are updated in ascending order of their address numbers (i.e., 0, 5, "a," 4, 9, 3, 8, 2, 7, 1, 6 and "b," in that order).

In the example of FIG. 6, the column count N is 3. Because the column count N in this case is equal to the maximum column count "a," the entire period becomes the write-ready period.

That is, in the initial write-ready period, write data "0" is written to address 0 while previously written data "0" is retrieved from the same address 0 as the read data.

In the next write-ready period, write data "1" is written to address 5 while previously written data "2" is retrieved from the same address 5 as the read data.

In the next write-ready period, write data "2" is written to address "a" while previously written data "4" is retrieved from the same address "a" as the read data.

In the next write-ready period, write data "3" is written to address 4 while previously written data "6" is retrieved from the same address 4 as the read data.

In the next write-ready period, write data "4" is written to address 9 while previously written data "1" is retrieved from the same address 9 as the read data.

In the next write-ready period, write data "5" is written to address 3 while previously written data "3" is retrieved from the same address 3 as the read data.

In the next write-ready period, write data "6" is written to address 8 while previously written data "5" is retrieved from the same address 8 as the read data.

In the next write-ready period, write data "7" is written to address 2 while previously written data "7" is retrieved from the same address 2 as the read data.

In the next write-ready period, write data "8" is written to address 7 while no data is retrieved from the same address 7 since no data was previously written at address 7.

In the next write-ready period, write data "9" is written to address 1 while no data is retrieved from the same address 1 since no data was previously written at address 1.

In the next write-ready period, write data "a" is written to address 6 while no data is retrieved from the same address 6 since no data was previously written at address 6.

In the next write-ready period, write data "b" is written to address "b" while no data is retrieved from the same address "b" since no data was previously written at address "b."

As a result of the sequence operations described above, the input signal Sa to the time deinterleaver 13 is written to the memory 21 in the form of (0, 1, 2), (3, 4, 5), (6, 7, 8), and (9, a, b) while the output signal Sb from the time deinterleaver 13 is retrieved from the memory 21 in the form of (0, 2, 4, 6), (1, 3, 5, 7), and (x, x, x, x).

As described, when attention is drawn to the read data (i.e., output signal Sb from the time deinterleaver 13), a two-column deinterleaving process is considered to be implemented.

[Structure of the Receiving System]

Figure 7:
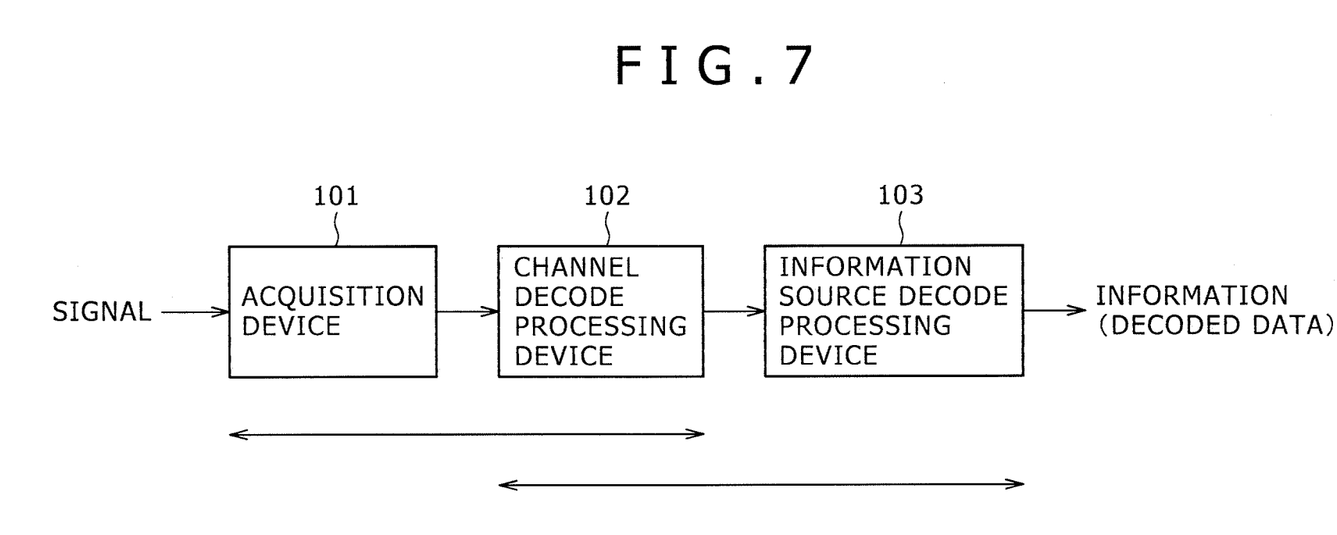
FIG. 7 is a block diagram showing a first structure example of a receiving system applicable to the receiving apparatus of FIG. 1.

FIG. 7 is a block diagram showing a first structure example of the receiving system applicable to the receiving apparatus of FIG. 1.

In FIG. 7, the receiving system is made up of an acquisition device 101, a channel decode processing device 102, and an information source decode processing device 103.

The acquisition device 101 acquires a signal including at least LDPC codes obtained by LDPC-coding target data such as the video and audio data of broadcast programs. Illustratively, the acquisition device 101 acquires the signal from such channels as terrestrial digital broadcasts, satellite digital broadcasts, CATV (Cable Television) networks, and other networks including the Internet, not shown, and supplies the acquired signal to the channel decode processing device 102.

Where the signal acquired by the acquisition device 101 has been broadcast illustratively by broadcasting stations using terrestrial waves, satellite waves or CATV networks, the acquisition device 101 is typically composed of a set-top box (STB) or the like. Where the signal acquired by the acquisition device 101 has been multicast by web servers in the form of IPTV (Internet Protocol Television), the acquisition device 101 is constituted illustratively by a network interface (I/F) such as a network interface card (NIC).

The channel decode processing device 102 performs channel decode processing including at least a process of correcting errors that may have occurred over the channels on the signal acquired by the acquisition device 101 from the channels. The channel decode processing device 102 forwards the signal thus processed to the information source decode processing device 103.

The signal acquired from the channels by the acquisition device 101 has undergone at least error-correcting coding aimed at correcting any errors that may have developed on the channels. Thus the channel decode processing device 102 carries out channel decode processing such as error correcting decoding on the acquired signal.

Typical error correcting coding techniques include LDPC coding and Reed-Solomon coding. With this embodiment, at least LDPC coding is assumed to be performed.

The channel decode processing may include demodulation of modulated signals.

On the signal having undergone the channel decode processing, the information source decode processing device 103 performs information source decode processing including at least a process of decompressing compressed information.

The signal acquired by the acquisition device 101 from the channels may have undergone compression coding for reducing the amount of the video and audio data involved. In that case, the information source decode processing device 103 performs information source decode processing such as decompression of compressed information on the signal having undergone channel decode processing.

If the signal acquired by the acquisition device 101 from the channels has not undergone compression coding, then the information source decode processing device 103 does not decompress compressed information.

Typical decompression techniques include MPEG (Moving Picture Experts Group) decoding. The channel decode processing may also include descrambling in addition to data decompression.

In the receiving system structured as described above, the acquisition device 101 acquires the signal typically made of video and audio data having undergone compression coding such as MPEG coding as well as error correcting coding such as LDPC coding. The signal thus acquired is sent to the channel decode processing device 102.

The channel decode processing device 102 performs as channel decode processing the same processes as those carried out by the components ranging from the demodulation device 11 to the BCH decoder 19 on the signal coming from the acquisition device 101. The signal resulting from the channel decode processing is supplied to the information source decode processing device 103.

The information source decode processing device 103 carries out information source decode processing such as MPEG decoding on the signal coming from the channel decode processing device 102. The pictures and/or sounds resulting from the information source decode processing are then output.

The above-described receiving system of FIG. 7 can be applied illustratively to TV tuners or the like for receiving digital TV broadcasts.

The acquisition device 101, channel decode processing device 102, and information source decode processing device 103 may each be structured as an independent device (hardware such as IC (integrated circuits)) or software module.

A set of at least two devices out of the acquisition device 101, channel decode processing device 102, and information source decode processing device 103 may be established as an independent device. One such set may illustratively be composed of the acquisition device 101 and channel decode processing device 102. Another set may be formed by the channel decode processing device 102 and information source decode processing device 103. Yet another set may be constituted by the acquisition device 101, channel decode processing device 102, and information source decode processing device 103.

Figure 8:
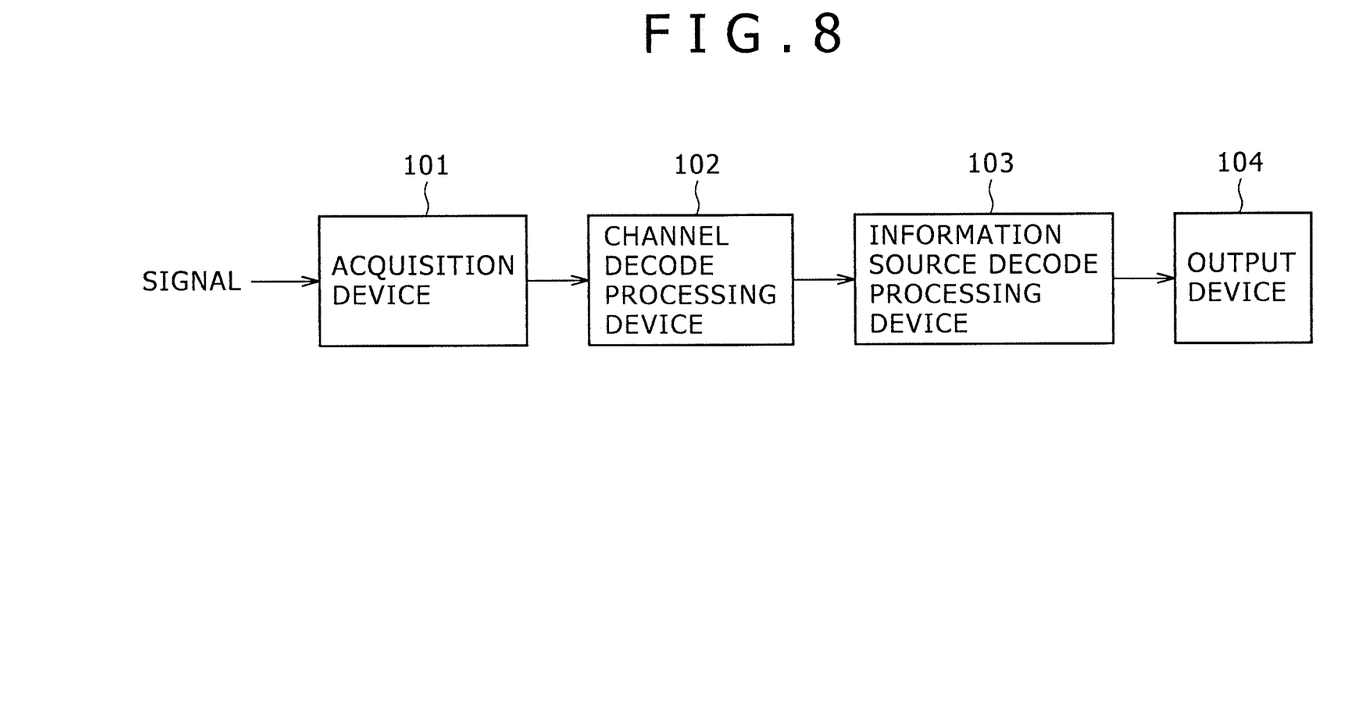
FIG. 8 is a block diagram showing a second structure example of the receiving system applicable to the receiving apparatus of FIG. 1.

FIG. 8 is a block diagram showing a second structure example of the receiving system applicable to the receiving apparatus of FIG. 1.

In FIG. 8, the components whose equivalents are found in FIG. 7 are designated by like reference numerals, and their descriptions will be omitted where appropriate.

The receiving system of FIG. 8 is common to that of FIG. 7 in that the system includes the acquisition device 101, the channel decode processing device 102 and information source decode processing device 103. What makes the receiving system of FIG. 8 different from that of FIG. 7 is that the system includes a newly added output device 104.

The output device 104 may be constituted by a display device for displaying pictures and/or by speakers for outputting sounds. As such, the output device 104 serves to output pictures and sounds derived from the signal output from the information source decode processing device 103. That is, the output device 104 displays pictures and/or outputs sounds.

The above-described receiving system of FIG. 8 may be applied illustratively to TV sets for receiving digital TV broadcasts or to radio receivers or the like for receiving radio broadcasts.

It should be noted that if the signal acquired by the acquisition device 101 has not undergone compression coding, then the signal output from the channel decode processing device 102 is sent directly to the output device 104.

Figure 9:
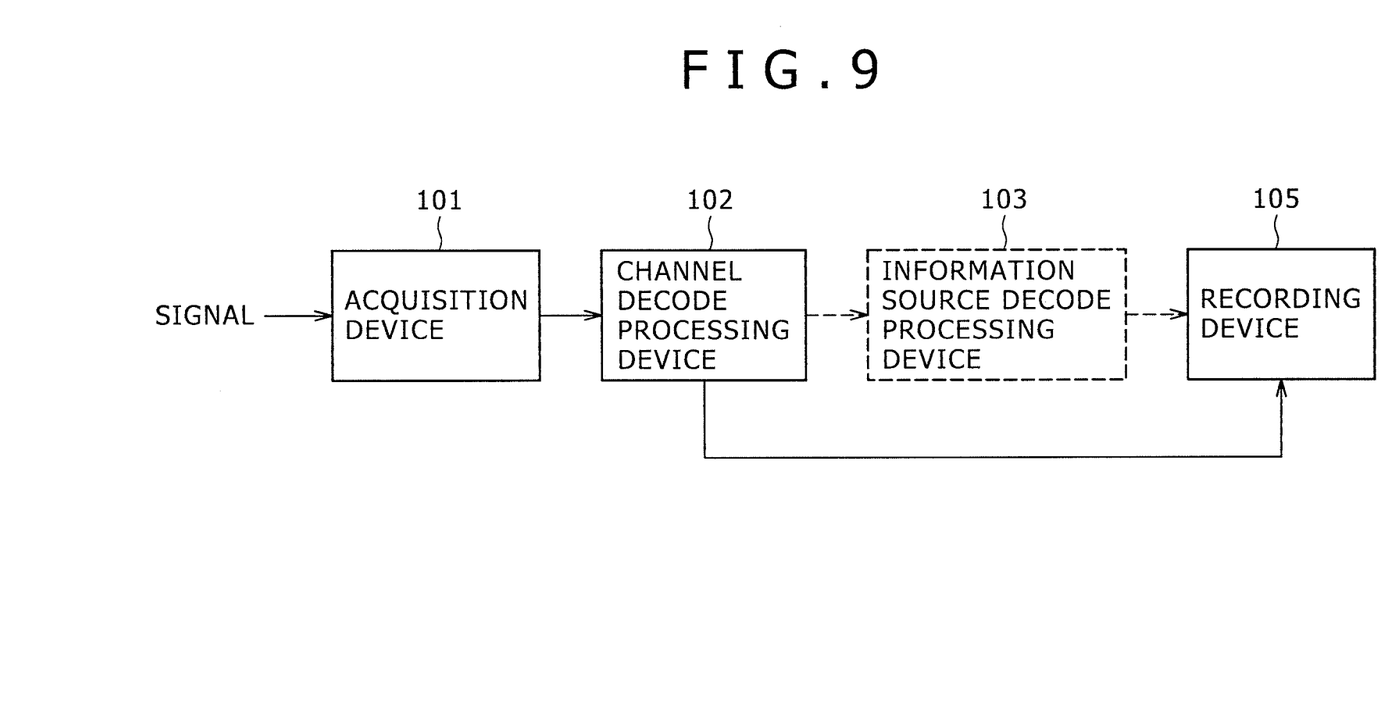
FIG. 9 is a block diagram showing a third structure example of the receiving system applicable to the receiving apparatus of FIG. 1.

FIG. 9 is a block diagram showing a third structure example of the receiving system applicable to the receiving apparatus of FIG. 1.

In FIG. 9, the components whose equivalents are found in FIG. 7 are designated by like reference numerals, and their descriptions will be omitted where appropriate.

The receiving system of FIG. 9 is common to that of FIG. 7 in that the system includes the acquisition device 101 and channel decode processing device 102.

What makes the receiving system of FIG. 9 different from that of FIG. 7 is that the system is not furnished with the information source decode processing device 103 and includes a newly added recording device 105.

The recording device 105 records (i.e., stores) the signal output from the channel decode processing device 102 (such as TS packets in the MPEG format) onto recording (storage) media such as optical disks, hard disks (magnetic disks), or flash memories.

The above-described receiving system of FIG. 9 can be applied illustratively to recorders or the like for recording TV broadcasts.

In FIG. 9, the receiving system may be structured to include the information source decode processing device 103 so that the signal having undergone information source decode processing, i.e., decoded pictures and sounds, may be recorded by the recording device 105.

[Applying the Present Embodiment to Programs]

The series of the processes described above may be executed either by hardware or by software.

Figure 10:
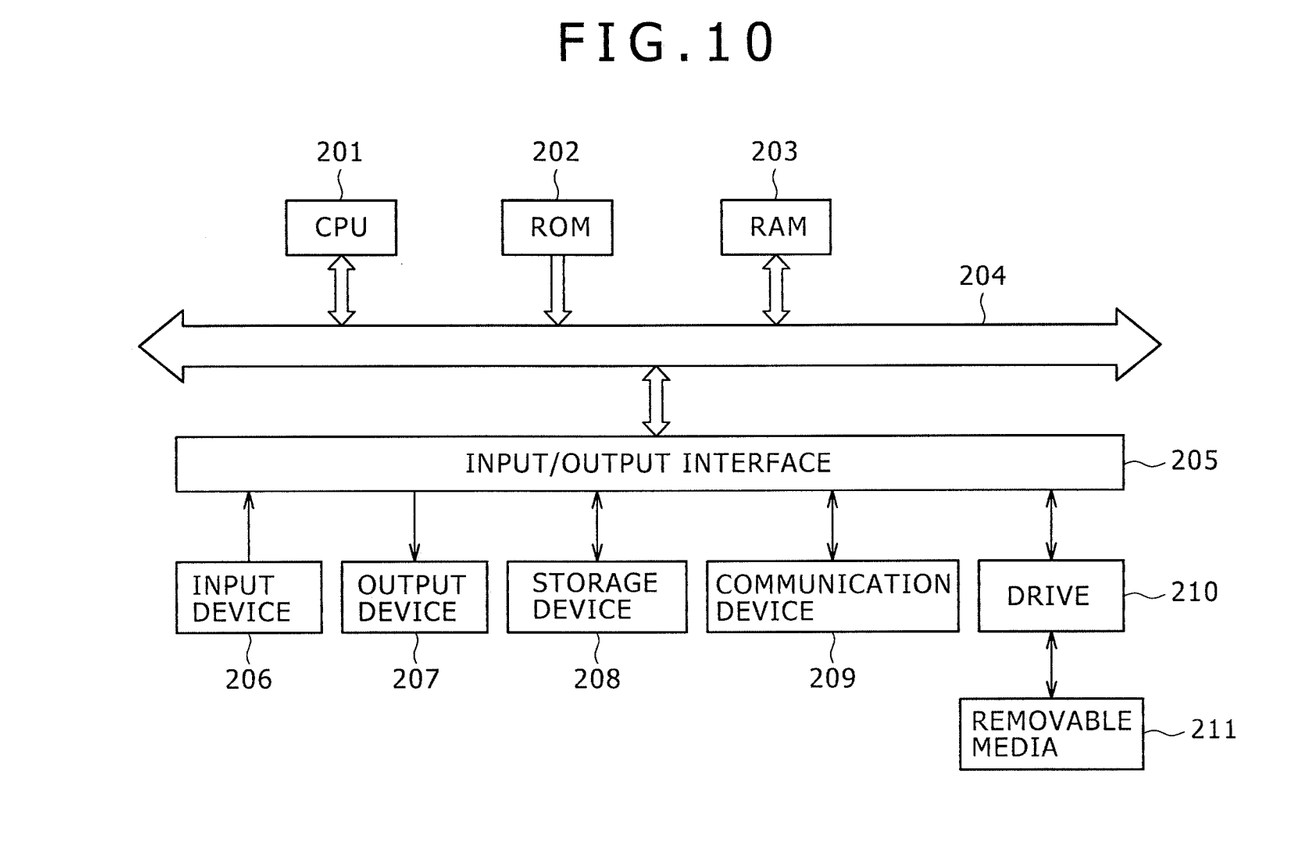
FIG. 10 is a block diagram showing a typical hardware structure of the receiving apparatus embodying the present invention.

In such cases, at least part of the receiving system including the above-described receiving apparatus may be constituted illustratively in the form of a computer shown in FIG. 10.

In FIG. 10, a CPU (central processing unit) 201 performs various processes according to the programs held in a ROM (read only memory) 202 or in keeping with the programs loaded into a RAM (random access memory) 203 from a storage device 208. The RAM 203 may also hold data needed by the CPU 201 in carrying out the diverse processing.

The CPU 201, ROM 202, and RAM 203 are interconnected via a bus 204. An input/output interface 205 is also connected to the bus 204.

The input/output interface 205 is connected with an input device 206 typically composed of a keyboard and a mouse and an output device 207 constituted illustratively by a display unit. The input/output interface 205 is further connected with a communication device 209 typically formed by a modem or a terminal adapter. The communication device 209 controls communications with other devices (not shown) via networks including the Internet.

A drive 210 is also connected as needed to the input/output interface 205. A piece of removable media 211 such as magnetic disks, optical disks, magneto-optical disks or semiconductor memories may be loaded into the drive 210. Computer programs retrieved from the loaded removable medium are installed as needed into the storage device 208.

Where the above-described processes are to be carried out by software, the programs constituting the software may be either incorporated beforehand in the dedicated hardware of the computer to be used or installed from a network or a recording medium into a general-purpose personal computer or like equipment capable of executing diverse functions based on the installed programs.

As shown in FIG. 10, the storage medium holding the programs thereon is offered to users not only as the removable media (package media) 211 apart from their computers and constituted by magnetic disks (including floppy disks) accommodating the program, optical disks (including CD- ROM (compact disk-read only memory) and DVD (digital versatile disc)), magneto-optical disks (including MD (Mini-disc)), or semiconductor memories; but also in the form of the ROM 202 or the hard disk contained in the storage device 208, each accommodating the programs and incorporated beforehand in the computers.

In this specification, the steps describing the programs stored on the recording media represent not only the processes that are to be carried out in the depicted sequence (i.e., on a time series basis) but also processes that may be performed parallelly or individually and not chronologically.

In this specification, the term "system" refers to an entire configuration made up of a plurality of component devices and processing elements.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-076031 filed in the Japan Patent Office on Mar. 26, 2009, the entire content of which is hereby incorporated by reference.

What is claimed is:

1. A receiving apparatus comprising:
   a deinterleaving device configured to perform a deinterleaving process on an LDPC-coded data signal having undergone an interleaving process, said LDPC representing low Density Parity Check, by use of a memory which has columns capable of storing as many as "a" data, said "a" being an integer of at least 1; and
   a control device configured such that if said data signal is supplied in units of N data, said N being an integer smaller than said "a;" then said control device controls said deinterleaving device to write said data signal to a predetermined address of said memory while reading previously written data from said predetermined address in a write period, said control device further controlling said deinterleaving device to stop writing said data signal to said predetermined address of said memory while reading said previously written data from said predetermined address in a write inhibit period.

2. The receiving apparatus according to claim 1, wherein the period in which to write said "a" data is determined to be one unit;
   said write period is predetermined to correspond to said N data; and
   said write inhibit period is predetermined to correspond to (a-N) data within said one unit.

3. The receiving apparatus according to claim 2, wherein the period corresponding to the first N data is predetermined to be said write period and the period corresponding to the last (a-N) data is predetermined to be said write inhibit period within said one unit.

4. The receiving apparatus according to claim 1, wherein said receiving apparatus complies with Digital Video Broadcasting T.2 known as DV B-T.2.

5. The receiving apparatus according to claim 1, wherein said data signal has undergone a block interleaving process across a plurality of LDPC codes.

6. A receiving method for use with a receiving apparatus including a deinterleaving device configured to perform a deinterleaving process on an LDPC-coded data signal having undergone an interleaving process, said LDPC representing Low Density Parity Check, by use of a memory which has columns capable of storing as many as "a" data, said "a" being an integer of at least 1, said receiving method comprising the steps of
   if said data signal is supplied in units of N data, said N being an integer smaller than said "a," then controlling said deinterleaving device to write said data signal to a predetermined address of said memory while reading previously written data from said predetermined address in a write period; and
   controlling said deinterleaving device to stop writing said data signal to said predetermined address of said memory while reading said previously written data from said predetermined address in a write inhibit period.

7. A non-transitory computer readable medium storing a program for use on a computer controlling a receiving apparatus including a deinterleaving device configured to perform a deinterleaving process on an LDPC-coded data signal having undergone an interleaving process, said LDPC representing Low Density Parity Cheek, by use of a memory which has columns capable of storing as many as "a" data, said "a" being an integer of at least 1, said program causing said computer to perform a control process comprising the steps of:
   if said data signal is supplied to said receiving apparatus in units of N data, said N being an integer smaller than said "a," then controlling said deinterleaving device to write said data signal to a predetermined address of said memory while reading previously written data from said predetermined address in a write period; and
   controlling said deinterleaving device to stop writing said data signal to said predetermined address while reading said previously written data from said predetermined address in a write inhibit period.

8. A receiving system comprising:
   an acquisition device configured such that if an LDPC-coded data signal having undergone an interleaving process, said LDPC representing Low Density Parity Check, is transmitted over a channel, then said acquisition device acquires said data signal;
   a transmission channel decoding device configured to perform a channel decoding process on said data signal acquired by said acquisition device over said channel, said channel decoding process at least including a process for correcting errors that may have occurred over said channel, said channel decoding device further outputting the signal thus processed; and
   either an information source decode processing device configured to perform an information source decoding process on the signal output from said channel decoding device, or a recording device configured to record the signal output from said channel decoding device to a recording medium;
   wherein said channel decoding device includes
      a deinterleaving device configured to perform a deinterleaving process on said data signal acquired by said acquisition device, by use of a memory which has columns capable of storing as many as "a" data, said "a" being an integer of at least 1, and
      a control device configured such that if said data signal is supplied in units of N data, said N being an integer smaller than said "a," then said control device controls said deinterleaving device to write said data signal to a predetermined address of said memory while reading previously written data from said predetermined address in a write period, said control device further controlling said deinterleaving device to stop writing said data signal to said predetermined address of said memory while reading said previously written data from said predetermined address in a write inhibit period.

9. A receiving apparatus comprising:

deinterleaving means for performing a deinterleaving process on an LDPC-coded data signal having undergone an interleaving process, said LDPC representing Low Density Parity Check, by use of a memory which has columns capable of storing as many as "a" data, said "a" being an integer of at least 1; and control means for, if said data signal is supplied in units of N data, said N being an integer smaller than said "a," controlling said deinterleaving means to write said data signal to a predetermined address of said memory while reading previously written data from said predetermined address in a write period, controlling said deinterleaving means to stop writing said data signal to said predetermined address of said memory while reading said previously written data from said predetermined address in a write inhibit period.

* * * * *